US012733502B2

(12) United States Patent
Jin et al.

(10) Patent No.: US 12,733,502 B2
(45) Date of Patent: Sep. 8, 2026

(54) CHIP-ON-FILM PACKAGE AND DISPLAY DEVICE INCLUDING THE SAME

(71) Applicant: LX SEMICON CO., LTD., Daejeon (KR)

(72) Inventors: Seung Hoon Jin, Daejeon (KR); Min Ho Jeon, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 289 days.

(21) Appl. No.: 18/428,322

(22) Filed: Jan. 31, 2024

(65) Prior Publication Data

US 2024/0258247 A1 Aug. 1, 2024

(30) Foreign Application Priority Data

Feb. 1, 2023 (KR) ........................ 10-2023-0013640

(51) Int. Cl.

| | |
|---|---|
| ***H10K 59/95*** | (2026.01) |
| ***H10W 42/00*** | (2026.01) |
| ***H10W 70/67*** | (2026.01) |
| *H10W 74/15* | (2026.01) |
| *H10W 90/00* | (2026.01) |

(52) U.S. Cl.

CPC ....... *H10W 42/121* (2026.01); *H10W 70/688* (2026.01); *H10K 59/95* (2023.02); *H10W 74/15* (2026.01); *H10W 90/00* (2026.01); *H10W 90/724* (2026.01); *H10W 90/734* (2026.01)

(58) Field of Classification Search

CPC . H10W 42/121; H10W 70/688; H10W 74/15; H10W 90/00; H10W 90/724; H10W 90/734; H10W 72/20; H10W 72/30; H10W 72/851; H10W 70/65; H10W 70/695; H10K 59/95; H10K 59/129; H10K 59/87; H05K 1/18

See application file for complete search history.

(56) References Cited

U.S. PATENT DOCUMENTS 9,362,333 B2 * 6/2016 Jung ...................... H10H 29/10
9,929,083 B2 * 3/2018 Ha ...................... H10W 70/688

* cited by examiner

*Primary Examiner* — David Vu

(74) *Attorney, Agent, or Firm* — ROTHWELL, FIGG, ERNST & MANBECK, P.C.

(57) ABSTRACT

Disclosed is a chip-on-film package capable of preventing damage to a surface thereof. The chip-on-film package includes a flexible base film, a first metal wiring layer formed on a first surface of the base film, a first surface insulating layer formed on the first metal wiring layer, a semiconductor chip connected to the first metal wiring layer through an opening formed in the first surface insulating layer, and a spacer formed on the first surface insulating layer within a target area, which is an area within which the first surface insulating layer and a structure of a display panel contact each other. At least one groove is formed in the first surface insulating layer within the target area, and the spacer includes a first spacer filled in the groove.

20 Claims, 14 Drawing Sheets

CHIP-ON-FILM PACKAGE AND DISPLAY DEVICE INCLUDING THE SAME

This application claims the benefit of Korean Patent Application No. 10-2023-0013640 filed on Feb. 1, 2023, which is hereby incorporated by reference in its entirety as if fully set forth herein.

BACKGROUND

Field

The present disclosure relates to a chip-on-film package, and more particularly, to a chip-on-film package having a surface protection function.

Discussion of the Related Art

In recent years, as the information age has arrived in earnest, display devices that display a large amount of data caused by various electrical signals as visual images have been extremely developed. In particular, as flat panel display devices having advantageous features such as lighter weight, thinner thickness, and lower power consumption, liquid crystal display (LCD) devices and organic light-emitting diode (OLED) display devices have been increasingly used.

A general flat panel display device typically includes a display panel forming images and a driving circuit board connected to one side of the display panel. The driving circuit board includes a chip-on-film (COF) package having one end attached to one side of the display panel and a printed circuit board (PCB) connected to the other end of the chip-on-film package.

However, when the chip-on-film package is attached to the display panel and is bent, the surface of the chip-on-film package may be damaged by a structure coupled to the display panel.

SUMMARY

The present disclosure has been made to solve the above problems, and a technical task of the present disclosure is to provide a chip-on-film package including a spacer to prevent damage to the surface thereof and a display device including the same.

In addition, another technical task of the present disclosure is to provide a chip-on-film package capable of preventing a material forming the spacer from flowing down and a display device including the same.

In order to accomplish the above and other objects, a chip-on-film package according to one aspect of the present disclosure includes a flexible base film, a first metal wiring layer formed on a first surface of the base film, a first surface insulating layer formed on the first metal wiring layer, a semiconductor chip connected to the first metal wiring layer through an opening formed in the first surface insulating layer, and a spacer formed on the first surface insulating layer within a target area, which is an area within which the first surface insulating layer and a structure of a display panel contact each other. At least one groove is formed in the first surface insulating layer within the target area, and the spacer includes a first spacer filled in the groove.

In addition, a chip-on-film package according to another aspect of the present disclosure includes a flexible base film, a metal wiring layer formed on the base film and including a first bonding portion, which is a region electrically connected to a display panel, and a second bonding portion, which is a region connected to a printed circuit board of the display panel, a surface insulating layer formed on the metal wiring layer, a semiconductor chip connected to the metal wiring layer through an opening formed in the surface insulating layer, and a spacer located within a bending area between the first bonding portion and the second bonding portion and formed on the surface insulating layer within a target area, which is an area within which the surface insulating layer and a structure of the display panel contact each other.

In addition, a display device according to still another aspect of the present disclosure includes a display panel, a structure coupled to the display panel, and a chip-on-film package configured to be bent about an axis extending in a first direction so as to be connected to the display panel. The chip-on-film package includes a base film, a metal wiring layer formed on the base film and including a first bonding portion, which is a region electrically connected to the display panel, and a second bonding portion, which is a region connected to a printed circuit board of the display panel, a surface insulating layer formed on the metal wiring layer, a semiconductor chip connected to the metal wiring layer through an opening formed in the surface insulating layer, and a spacer located within a bending area between the first bonding portion and the second bonding portion and formed on the surface insulating layer within a target area, which is an area within which the surface insulating layer and the structure of the display panel contact each other, to protect the surface insulating layer.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
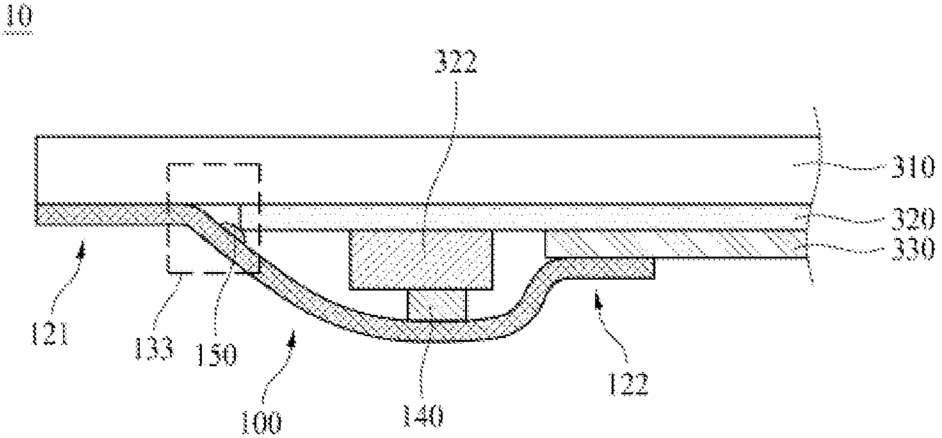
FIG. 1 is a view showing a display device including a chip-on-film package according to a first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the following description, when a configuration and a function known to those skilled in the art are irrelevant to the essential configuration of the present disclosure, a detailed description thereof will be omitted. The terms described in the specification should be understood as follows.

Advantages and features of the present disclosure and methods for achieving the same will be made clear from embodiments described below in detail with reference to the accompanying drawings. The present disclosure may however, be embodied in many different forms, and should not be construed as being limited to the embodiments set forth herein. Rather, these embodiments are provided so that this disclosure will be thorough and complete, and will fully convey the scope of the disclosure to those skilled in the art. Furthermore, the present disclosure is only defined by scopes of the claims.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used therewith.

It may be understood that, although the terms "first", "second", etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless otherwise mentioned.

An "X-axis direction", a "Y-axis direction", and a "Z-axis direction" should not be construed as only a geometric relationship where a relationship therebetween is perpendicular, and may denote having a broader directionality within a scope within which elements of the present disclosure operate functionally.

The term "at least one" should be understood as including all possible combinations which can be suggested from one or more relevant items. For example, the meaning of "at least one of a first item, a second item, or a third item" may be each one of the first item, the second item, or the third item and also be all possible combinations that can be suggested from two or more of the first item, the second item, and the third item.

The respective features of the various embodiments of the present disclosure may be partially or entirely coupled to and combined with each other, and various technical linkages and modes of operation thereof are possible. These various embodiments may be performed independently of each other, or may be performed in association with each other.

Hereinafter, embodiments of the present disclosure will be described in detail with reference to the accompanying drawings.

Figure 2:
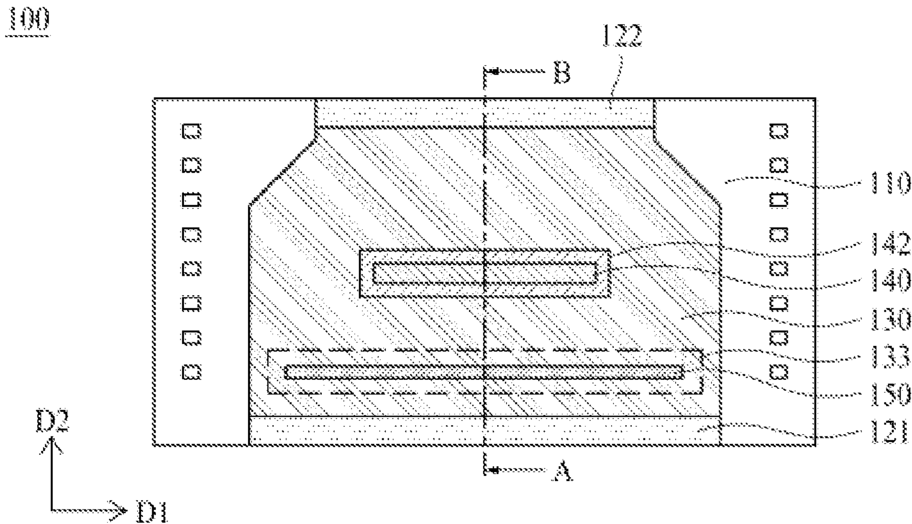
FIG. 2 is a plan view of the chip-on-film package according to the first embodiment of the present disclosure.
Figure 3A:
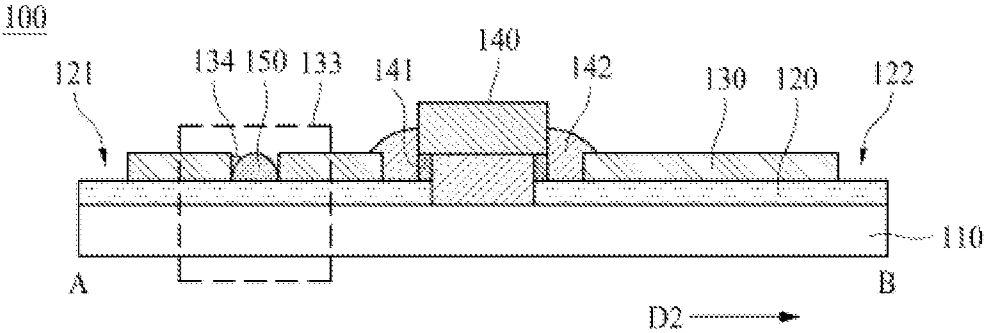
FIGS. 3A and 3B are cross-sectional views of the chip-on-film package shown in FIG. 2.
Figure 3B:
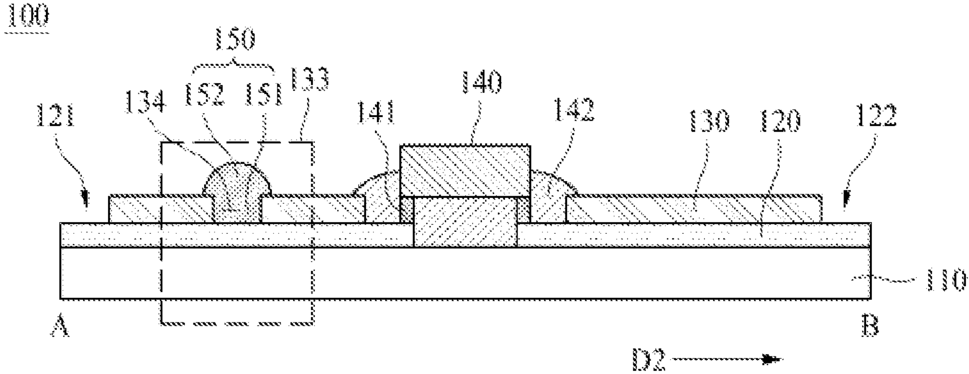

FIG. 1 is a view showing a display device including a chip-on-film package according to a first embodiment of the present disclosure, FIG. 2 is a plan view of the chip-on-film package shown in FIG. 1, and FIGS. 3A and 3B are cross-sectional views of the chip-on-film package shown in FIG. 2.

As shown in FIG. 1, the display device 10 includes a display panel 310, a structure 320, a printed circuit board 330, and a chip-on-film package 100.

The display panel 310 may be a panel including a thin-film transistor (TFT) substrate and a pixel circuit. The display panel 310 may be, for example, an organic light-emitting diode (OLED) panel.

The structure 320 protects and seals the rear surface of the display panel 310. In one embodiment, the structure 320 may be a metal encapsulation layer that protects the rear surface of a thin-film transistor (TFT) substrate of an organic light-emitting diode (OLED) display device.

The printed circuit board (PCB) 330 may be electrically connected to the chip-on-film package 100, and may have a circuit pattern formed thereon to drive the display panel 310.

In one embodiment, a cushion pad part 322 may be additionally formed on the structure 320 of the display device 10 in order to absorb impact applied to a semiconductor chip 140 on which the chip-on-film package 100 is mounted.

The chip-on-film package 100 includes a semiconductor chip 140 to drive the display panel 310. In particular, the chip-on-film package 100 according to the present disclosure includes a spacer 150 formed within a target area 133 in which the chip-on-film package 100 is brought into contact with the structure 320 when the chip-on-film package 100 is bent so as to be connected to the display panel 310. Therefore, it may be possible to prevent a surface insulating layer 130 of the chip-on-film package 100 from being damaged by the structure 320 when the chip-on-film package 100 is bent. Hereinafter, the configuration of the chip-on-film package 100 according to the present disclosure will be described in more detail.

As shown in FIGS. 1 to 3, the chip-on-film package 100 according to the first embodiment of the present disclosure includes a base film 110, a metal wiring layer 120, a surface insulating layer 130, a semiconductor chip 140, and a spacer 150.

The base film 110 is provided in the form of a flexible film, and is bent about an axis extending in a first direction D1. For example, the base film 110 may be provided in the form of a flexible film such as polyimide (PI), and may be bent about an axis extending in the first direction D1 corresponding to the long side of the semiconductor chip 140.

The metal wiring layer 120 is formed on the base film 110 so as to have a predetermined pattern. The metal wiring layer 120 includes a first bonding portion 121 and a second bonding portion 122. The first bonding portion 121 may be a region of the metal wiring layer 120 that is exposed to the outside so as to be electrically connected to the display panel 310. The second bonding portion 122 may be a region of the metal wiring layer 120 that is exposed to the outside so as to be electrically connected to the printed circuit board 330 of the display panel 310. The first bonding portion 121 and the second bonding portion 122 may be formed so as to face each other in a second direction D2.

In addition, an opening may be patterned in the metal wiring layer 120 in order to expose a portion of the base film 110 corresponding to a region in which the semiconductor chip 140 is disposed.

In one embodiment, the metal wiring layer 120 may be formed of a material having high electrical conductivity, such as copper (Cu).

The surface insulating layer 130 is formed on the metal wiring layer 120. For example, the surface insulating layer 130 may be formed of a surface resist (SR) or a solder resist (SR) in order to protect the metal wiring layer 120 and to prevent the metal wiring layer 120 from being short-circuited.

In the embodiment, at least one groove 134 is formed in the surface insulating layer 130 within the target area 133 in which the surface insulating layer 130 is brought into contact with the structure 320 of the display panel 310. In the embodiment, the reason for forming the groove 134 in the surface insulating layer 130 within the target area 133 is to fill the spacer 150 in the groove 134 in order to prevent the surface insulating layer 130 from contacting the structure 320 of the display panel 310 when the chip-on-film package 100 is bent so as to be connected to the display panel 310. If the spacer 150 is formed on the surface insulating layer 130, a material forming the spacer 150 may flow down to the first bonding portion 121. In order to prevent this problem, the spacer 150 is filled in the groove 134.

Although it has been described with reference to FIGS. 3A and 3B that the groove 134 is formed in the surface insulating layer 130 composed of a single layer within the target area 133, the groove 134 may be formed in any of various shapes in the surface insulating layer 130. Hereinafter, various shapes of the groove 134 formed within the target area 133 will be described in detail with reference to FIGS. 4A to 4C.

Figure 4A:
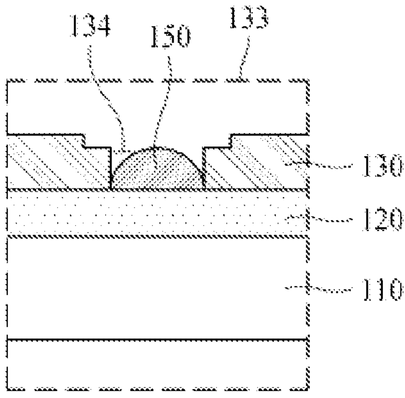
FIGS. 4A to 4C are partial cross-sectional views of chip-on-film packages in which grooves according to various embodiments are formed.
Figure 4B:
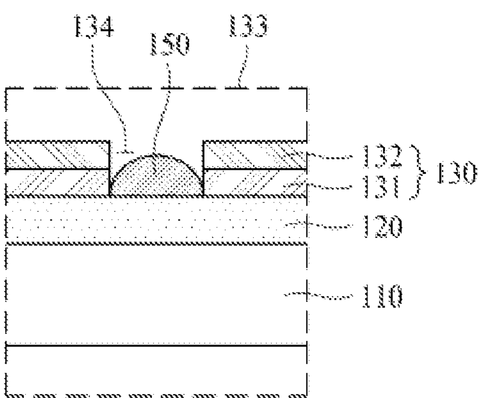
Figure 4C:
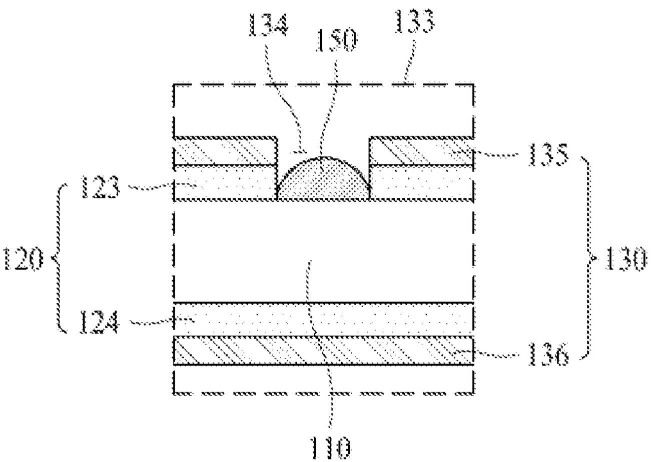

FIGS. 4A to 4C are partial cross-sectional views of chip-on-film packages in which grooves according to various embodiments are formed.

For convenience of explanation, the spacer 150 is illustrated in FIGS. 4A to 4C as being formed only in the groove 134. However, the disclosure is not limited thereto. The spacer 150 shown in FIGS. 4A to 4C may also be formed on the upper surface of the surface insulating layer 130 within the target area 133, as shown in FIG. 3B.

As shown in FIG. 4A, the groove 134 may be formed in the surface insulating layer 130 within the target area 133 so as to have a step. In an example, as shown in FIG. 4A, the groove 134 may be formed in the surface insulating layer 130 so as to have a step to form a two-stage configuration.

In another embodiment, as shown in FIG. 4B, the surface insulating layer 130 may include a first sub-surface insulating layer 131 formed on the base film 110 and a second sub-surface insulating layer 132 formed on the first sub-surface insulating layer 131. The groove 134 may be formed so as to penetrate both the first and second sub-surface insulating layers 131 and 132 within the target area 133.

In other words, while the surface insulating layer 130 shown in FIG. 4A is composed of a single layer, the surface insulating layer 140 shown in FIG. 4B may be composed of two layers 131 and 132.

In still another embodiment, as shown in FIG. 4C, the chip-on-film package 100 may be formed in a double-sided structure. In this case, the metal wiring layer 120 may include a first metal wiring layer 123 formed on a first surface of the base film 110 to which the semiconductor chip 140 is connected and a second metal wiring layer 124 formed on a second surface (surface opposite the first surface) of the base film 110, and the surface insulating layer 130 may include a first surface insulating layer 135 formed on the first metal wiring layer 123 and a second surface insulating layer 136 formed under the second metal wiring layer 124 based on FIG. 4C. In this embodiment, the groove 134 formed within the target area 133 may be formed so as to penetrate both the first metal wiring layer 123 and the first surface insulating layer 135.

Meanwhile, the shape of the groove 134 formed in the chip-on-film package 100 according to the first embodiment of the present disclosure is not limited to the shapes shown in FIGS. 3A, 3B, and 4A to 4C, and the groove 134 may be formed in any of various shapes, so long as the groove 134 is capable of preventing a material forming the spacer 150 from flowing down.

Referring back to FIGS. 1 to 3, an opening is formed in the surface insulating layer 130 in order to expose a portion of the base film 110 corresponding to a region in which the semiconductor chip 140 is mounted. To this end, the surface insulating layer 130 may be formed on the metal wiring layer 120 through a printing scheme using a mesh-type mask. In order to additionally form the groove 134, an additional mask for formation of the groove may be used, or a halftone mask may be used to simultaneously form the opening and the groove 134.

In one embodiment, the groove 134 may be formed in the surface insulating layer 130 so as to be located between the first bonding portion 121 and the semiconductor chip 140 in the second direction D2 and to extend in the first direction D1. For example, in the case in which the base film 110 is bent about an axis extending in the first direction D1, the groove 134 may be formed in the surface insulating layer 130 so as to extend in the first direction D1 between the first bonding portion 121 and the semiconductor chip 140. Accordingly, the spacer 150 filled in the groove 134 may also be formed so as to extend in the first direction D1.

Meanwhile, the chip-on-film package 100 according to the first embodiment of the present disclosure is bent about an axis extending in the first direction D1 so as to be connected to the display panel 310. In this case, the bending area may be defined between the first bonding portion 121 and the second bonding portion 122. Meanwhile, the position of the target area 133 within which the groove 134 is formed may be changed within the bending area depending on the position of the structure 320 of the display panel, and at least one groove may be formed so as to extend in the first direction D1 within a target area (not shown) located between the semiconductor chip 140 and the second bonding portion 122 in the second direction D2.

Figure 5:
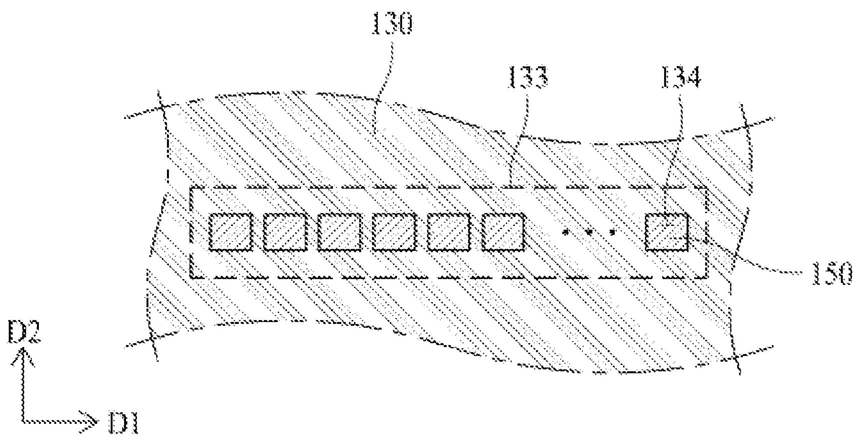
FIG. 5 is a partial plan view of the chip-on-film package in which a plurality of grooves is formed within a target area.

One groove 134 is illustrated in FIG. 2 as extending in the first direction D1 within the target area 133. However, in another embodiment, a plurality of grooves may be formed within the target area 133. In detail, as shown in FIG. 5, a plurality of grooves 134 may be formed within the target area 133 so as to be spaced apart from each other at predetermined intervals in the first direction D1. Accordingly, the spacers 150 filled in the respective grooves 134 may also be spaced apart from each other at predetermined intervals in the first direction D1.

Referring back to FIGS. 1 to 3, the semiconductor chip 140 is electrically connected to the metal wiring layer 120 through the opening formed in the surface insulating layer 130. For example, the semiconductor chip 140 may be a display driver integrated circuit (IC) (DDI) that drives pixels of the display panel or may be another semiconductor chip associated with driving of the display panel.

In this case, the semiconductor chip 140 may be electrically connected to the metal wiring layer 120 exposed through the opening formed in the surface insulating layer 130 via a plurality of bumps 141. In addition, a molding member 142 may be formed in the opening and between the surface insulating layer 130 and the semiconductor chip 140. The molding member 142 may be formed of a molding resin, and may serve to stably fix the semiconductor chip 140 and to dissipate heat generated by operation of the semiconductor chip 140 to the outside.

The spacer 150 is filled in the groove 134 formed in the surface insulating layer 130. In one embodiment, as shown in FIG. 3B, the spacer 150 may be formed not only in the groove 134 but also on the surface insulating layer 130. That is, the spacer 150 includes a first spacer 151 filled in the groove 134 and a second spacer 152 formed on the first spacer 151. The second spacer 152 is formed on the upper surface of a portion of the surface insulating layer 130 around the groove 134.

For example, as shown in FIG. 3A, the spacer 150 may be filled only in the groove 134. Alternatively, as shown in FIG. 3B, the first spacer 151 may be filled in the groove 134, and the second spacer 152 may be formed on the first spacer 151 so as to cover a portion of the upper surface of the surface insulating layer 130.

In one embodiment, the spacer 150 may be formed of an epoxy resin.

Figure 6:
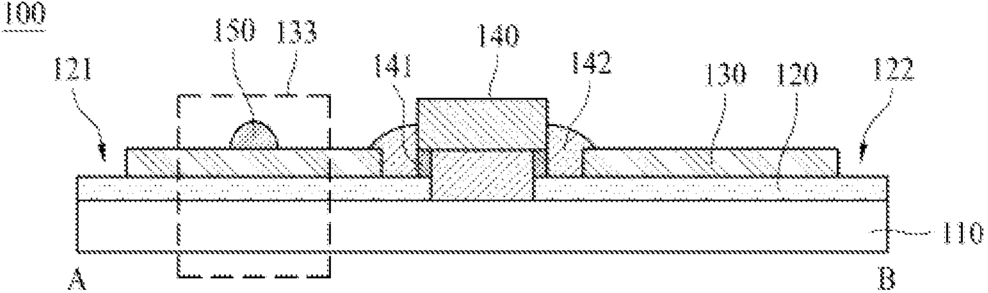
FIGS. 6 and 7 are cross-sectional views of chip-on-film packages including a spacer according to another embodiment.
Figure 7:
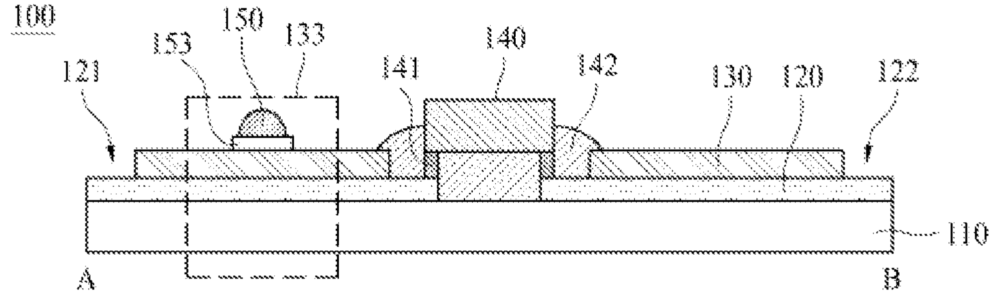

The spacer 150 has been described in the above embodiment as being filled in the groove 134 formed in the surface insulating layer 130. However, in another embodiment, as shown in FIGS. 6 and 7, in the case in which the groove 134 is not formed in the surface insulating layer 130, the spacer 150 may be directly formed on the surface insulating layer 130. In this embodiment, in order to enhance adhesion between the surface insulating layer 130 and the spacer 150, the spacer 150 may be formed of an epoxy resin having viscosity of 530 cP (centipoise) to 3300 cP, e.g., an epoxy resin having viscosity of 2100 cP or 3300 cP.

Hereinafter, an embodiment in which the spacer 150 is formed directly on the surface insulating layer 130 will be described in more detail with reference to FIGS. 6 and 7.

FIGS. 6 and 7 are cross-sectional views of chip-on-film packages including a spacer according to another embodiment. As shown in FIGS. 6 and 7, the chip-on-film package 100 according to the present disclosure includes a base film 110, a metal wiring layer 120, a surface insulating layer 130, a semiconductor chip 140, and a spacer 150.

The chip-on-film package 100 according to the present disclosure shown in FIGS. 6 and 7 has the same configuration as the chip-on-film packages 100 shown in FIGS. 3A and 3B, except that no groove is formed within the target area 133 and the spacer 150 is directly formed on the surface insulating layer 130. Therefore, hereinafter, only a difference from the chip-on-film package 100 shown in FIGS. 3A and 3B will be described.

In the chip-on-film package 100 shown in FIGS. 6 and 7, since no groove is formed in the surface insulating layer 130, the spacer 150 is formed on the surface insulating layer 130 within the target area 133.

Although the spacer 150 is illustrated in FIG. 6 as being directly formed on the surface insulating layer 130, the disclosure is not limited thereto. As shown in FIG. 7, the spacer 150 may be formed on the surface insulating layer 130 using an adhesive 153.

Figure 8:
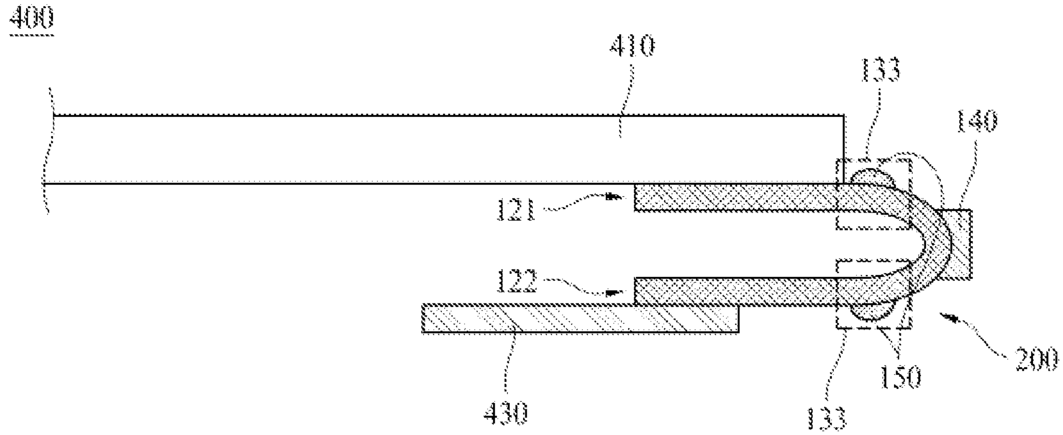
FIG. 8 is a view showing a display device including a chip-on-film package according to a second embodiment of the present disclosure.
Figure 9:
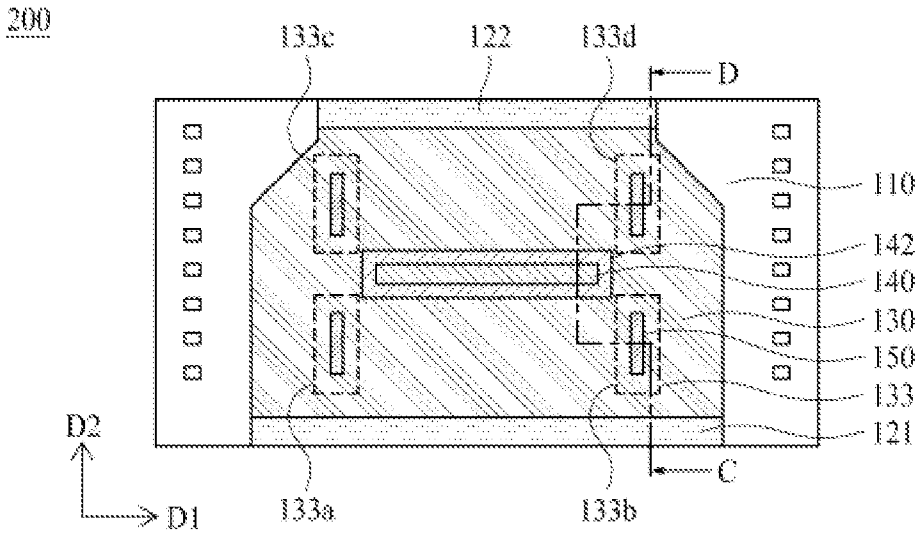
FIG. 9 is a plan view of the chip-on-film package according to the second embodiment of the present disclosure.
Figure 10:
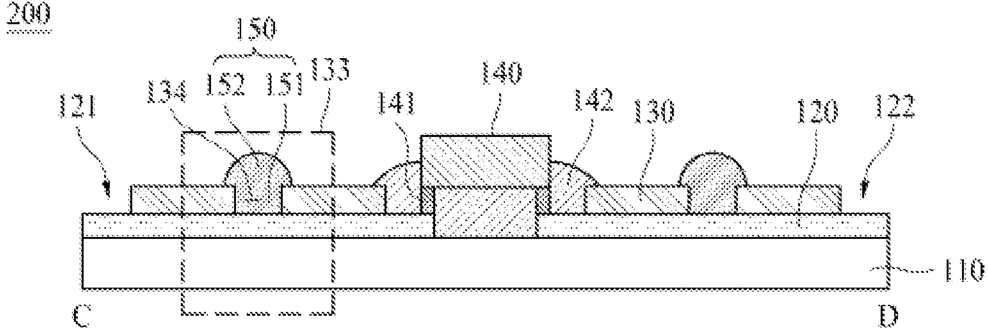
FIG. 10 is a cross-sectional view of the chip-on-film package shown in FIG. 9.

FIG. 8 is a view showing a display device including a chip-on-film package according to a second embodiment of the present disclosure, FIG. 9 is a plan view of the chip-on-film package according to the second embodiment of the present disclosure, and FIG. 10 is a cross-sectional view of the chip-on-film package shown in FIG. 8.

A display device 400 shown in FIG. 8 includes a display panel 410, a structure (not shown), a printed circuit board 430, and a chip-on-film package 200.

The display panel 410 may be a panel including a thin-film transistor (TFT) substrate. The display panel 410 may be, for example, a liquid crystal display panel. In addition, the structure (not shown) may protect the display panel 410. For example, various structures, such as front/rear cases and mold frames, may be coupled to the display panel 410.

Similar to what is illustrated in FIG. 1, a first bonding portion 121 of the chip-on-film package 200 is electrically connected to a source pad part (not shown) formed on the display panel 410, and a second bonding portion 122 of the chip-on-film package 200 is connected to the printed circuit board 430 of the display panel 410.

The chip-on-film package 200 includes a semiconductor chip 140 to drive the display panel 410. The semiconductor chip 140 included in the chip-on-film package 200 according to the present disclosure is located on the same plane as the first and second bonding portions 121 and 122. However, the chip-on-film package 200 is bent such that the semiconductor chip 140 faces outwards, unlike what is illustrated in FIG. 1.

In particular, the chip-on-film package 200 according to the present disclosure includes spacers 150 formed within a target area 133 in which the chip-on-film package 200 is brought into contact with the structure when the chip-on-film package 200 is bent so as to be connected to the display panel 410. Therefore, it may be possible to prevent the chip-on-film package 200 from being damaged by the structure when the chip-on-film package 200 is bent. In this case, the spacers 150 may be formed within a first area between the first bonding portion 121 and the semiconductor chip 140 and a second area between the semiconductor chip 140 and the second bonding portion 122 among the target area 133.

Hereinafter, the configuration of the chip-on-film package 200 according to the second embodiment of the present disclosure will be described in more detail. As shown in FIGS. 8 to 10, the chip-on-film package 200 according to the second embodiment of the present disclosure includes a base film 110, a metal wiring layer 120, a surface insulating layer 130, a semiconductor chip 140, and spacers 150.

The chip-on-film package 200 according to the second embodiment of the present disclosure shown in FIGS. 9 and 10 has the same configuration as the chip-on-film package 100 according to the first embodiment of the present disclosure shown in FIGS. 2 to 3B, except that a groove 134 formed within the target area 133 extends in the second direction D2.

Therefore, hereinafter, only a difference from the chip-on-film package shown in FIGS. 2 to 3B will be described.

Similar to the chip-on-film package 100 according to the first embodiment, the chip-on-film package 200 according to the second embodiment of the present disclosure is bent about an axis extending in the first direction D1, in which the first and second bonding portions 121 and 122 extend, so as to be connected to the display panel 410. In this case, the bending area may be defined as an area between the first bonding portion 121 and the second bonding portion 122. In addition, the position of the target area 133 within which the groove 134 is formed may be changed within the bending area depending on the position of the structure of the display panel 410. In one embodiment, the chip-on-film package 200 according to the second embodiment may include a plurality of target areas 133. In an example, as shown in FIG. 9, two target areas 133*a* and 133*b* may be located within a first area between the first bonding portion 121 and the semiconductor chip 140, and two target areas 133*c* and 133*d* may be located within a second area between the semiconductor chip 140 and the second bonding portion 122 among the bending area.

In this case, the groove 134 is formed within each of the target areas 133*a* to 133*d* so as to extend in the second direction D2 perpendicular to the first direction D1. Accordingly, the spacer 150 filled in the groove 134 is formed so as to extend in the second direction D2. In one embodiment, the spacer 150 may include a first spacer 151 and a second spacer 152, as shown in FIG. 10.

In detail, as shown in FIG. 10, at least one groove 134 is formed within each of the target areas 133*a* to 133*d*, the first spacer 151 is filled in the groove 134, and the second spacer 152 is formed on the first spacer 151. For convenience of explanation, the spacer 150 is illustrated in FIG. 10 as including the first spacer 151 filled in the groove 134 and the second spacer 152 formed on the first spacer 151. However, the disclosure is not limited thereto. Similar to the first embodiment shown in FIG. 3A, the spacer 150 may be formed only in the groove 134. Further, in the second embodiment, the groove 134 and the spacer 150 may be provided in the same forms as those shown in FIGS. 4A to 4C.

Figure 11:
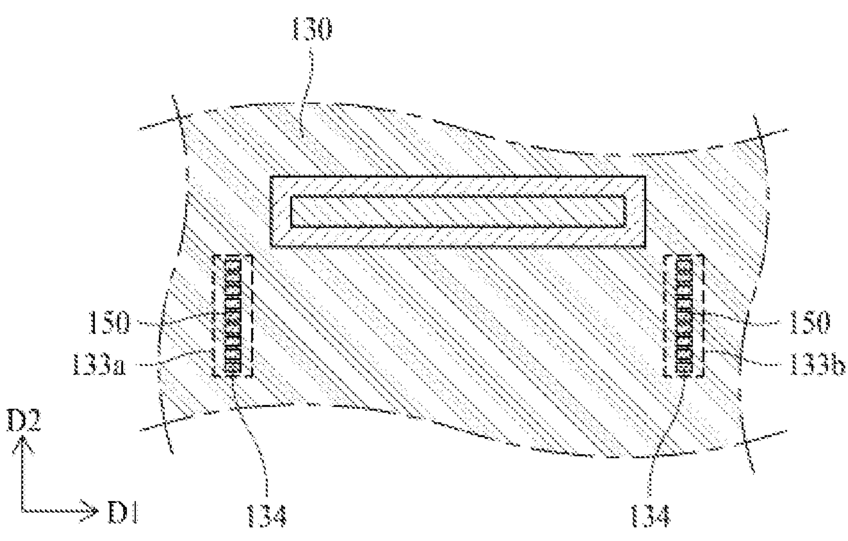
FIG. 11 is a partial plan view of the chip-on-film package in which a plurality of grooves is formed within a target area.

In FIG. 9, one groove 134 is illustrated as extending in the second direction D2 within each of the target areas 133*a* to 133*d*. However, in another embodiment, a plurality of grooves may be formed within each of the target areas 133*a* to 133*d*. In detail, as shown in FIG. 11, a plurality of grooves 134 may be formed in the surface insulating layer 130 within each of the target areas 133*a* and 133*b* so as to be spaced apart from each other at predetermined intervals in the second direction D2. Accordingly, the spacers 150 filled in the respective grooves 134 may also be spaced apart from each other at predetermined intervals in the second direction D2.

As described above, according to the various embodiments of the present disclosure, when the chip-on-film package 100 or 200 is bent so as to be connected to the display panel 310 or 410, the spacer 150 formed on the surface insulating layer 130 prevents the chip-on-film package 100 or 200 from being damaged by a structure of the display panel 310 or 410. In addition, since the groove 134 is formed in the surface insulating layer 130 and the spacer 150 is formed in the groove 134, it may be possible to prevent a material (e.g., epoxy resin) forming the spacer 150 from flowing down to the first bonding portion 121 or the second bonding portion 122, which is coupled to the display panel 310 or 410, when the spacer 150 is formed.

As is apparent from the above description, according to the present disclosure, since a spacer is formed on a chip-on-film package, the spacer may prevent a structure of a display panel from directly contacting the surface of the chip-on-film package when the chip-on-film package is bent so as to be connected to the display panel, thereby preventing the surface of the chip-on-film package from being damaged by the structure of the display panel.

In addition, according to the present disclosure, since a groove is formed in a surface insulating layer of the chip-on-film package, it may be possible to prevent a material forming the spacer from flowing down to a bonding portion, which is coupled to the display panel.

While the present disclosure has been particularly shown and described with reference to exemplary embodiments thereof, these embodiments are only proposed for illustrative purposes, and it will be apparent to those skilled in the art that various changes in form and details may be made without departing from the essential characteristics of the present disclosure.

Therefore, the exemplary embodiments should be considered in a descriptive sense only and not for purposes of limitation. The scope of the disclosure is defined not by the detailed description of the disclosure but by the appended claims, and encompasses all modifications and equivalents that fall within the scope of the appended claims.

What is claimed is:

1. A chip-on-film package comprising:

a flexible base film;

a first metal wiring layer formed on a first surface of the base film;

a first surface insulating layer formed on the first metal wiring layer;

a semiconductor chip connected to the first metal wiring layer through an opening formed in the first surface insulating layer; and a spacer formed on the first surface insulating layer within a target area, the target area being an area within which the first surface insulating layer and a structure of a display panel contact each other, wherein at least one groove is formed in the first surface insulating layer within the target area, and wherein the spacer comprises a first spacer filled in the at least one groove.

2. The chip-on-film package according to claim 1, wherein the spacer further comprises a second spacer formed on the first spacer, and wherein the second spacer is additionally formed in an area including a portion of an upper surface of the first surface insulating layer and the at least one groove.

3. The chip-on-film package according to claim 1, wherein the groove is formed in the first surface insulating layer so as to have a step.

4. The chip-on-film package according to claim 1, wherein the first surface insulating layer comprises a first sub-surface insulating layer and a second sub-surface insulating layer formed on the first sub-surface insulating layer, and wherein the groove is formed so as to penetrate the first and second sub-surface insulating layers.

5. The chip-on-film package according to claim 1, further comprising:

a second metal wiring layer formed under a second surface of the base film; and a second surface insulating layer formed under the second metal wiring layer, wherein the groove is formed so as to penetrate the first metal wiring layer and the first surface insulating layer.

6. The chip-on-film package according to claim 1, wherein the base film is bent about an axis extending in a first direction, wherein the first metal wiring layer comprises a first bonding portion and a second bonding portion, the first bonding portion being a region of the first metal wiring layer electrically connected to the display panel, the second bonding portion being a region of the first metal wiring layer electrically connected to a printed circuit board of the display panel, and wherein the groove is formed in the first surface insulating layer within an area between the first bonding portion and the semiconductor chip so as to extend in the first direction.

7. The chip-on-film package according to claim 6, wherein the first surface insulating layer is provided with one groove extending in the first direction, or is provided with a plurality of grooves and a plurality of spacers, and wherein the plurality of grooves are spaced apart from each other at predetermined intervals in the first direction, and the plurality of spacers are spaced apart from each other at predetermined intervals in the first direction.

8. The chip-on-film package according to claim 1, wherein the base film is bent about an axis extending in a first direction wherein the first metal wiring layer comprises a first bonding portion and a second bonding portion, the first bonding portion being a region electrically connected to the display panel, the second bonding portion being a region electrically connected to a printed circuit board of the display panel, wherein the first surface insulating layer is provided with a first groove and a second groove, and wherein the first and second grooves are formed in the first surface insulating layer within any one of a first area between the first bonding portion and the semiconductor chip, or a second area between the semiconductor chip and the second bonding portion.

9. The chip-on-film package according to claim 8, wherein the first surface insulating layer is further provided with a third groove and a fourth groove, and wherein the third and fourth grooves are formed within a remaining one of the first area or the second area.

10. The chip-on-film package according to claim 8, wherein the first surface insulating layer is provided with one first groove and one second groove extending in a second direction, or is provided with a plurality of first grooves and a plurality of second grooves, and wherein the plurality of first grooves are spaced apart from each other at predetermined intervals in the second direction, and the plurality of second grooves are spaced apart from each other at predetermined intervals in the second direction.

11. The chip-on-film package according to claim 1, wherein the spacer is formed of an epoxy resin.

12. A chip-on-film package comprising:

a flexible base film;

a metal wiring layer formed on the base film, the metal wiring layer comprising a first bonding portion and a second bonding portion, the first bonding portion being a region electrically connected to a display panel, the second bonding portion being a region connected to a printed circuit board of the display panel;

a surface insulating layer formed on the metal wiring layer;

a semiconductor chip connected to the metal wiring layer through an opening formed in the surface insulating layer; and a spacer located within a bending area between the first bonding portion and the second bonding portion and formed on the surface insulating layer within a target area, the target area being an area within which the surface insulating layer and a structure of the display panel contact each other.

13. The chip-on-film package according to claim 12, wherein the spacer is formed of an epoxy resin having viscosity of 530 cP to 3300 cP.

14. The chip-on-film package according to claim 12, wherein the spacer is attached to the surface insulating layer using an adhesive.

15. A display device comprising:

a display panel;

a structure coupled to the display panel; and a chip-on-film package configured to be bent about an axis extending in a first direction so as to be connected to the display panel, wherein the chip-on-film package comprises:

a base film;

a metal wiring layer formed on the base film, the metal wiring layer comprising a first bonding portion and a second bonding portion, the first bonding portion being a region electrically connected to the display panel, the second bonding portion being a region connected to a printed circuit board of the display panel;

a surface insulating layer formed on the metal wiring layer;

a semiconductor chip connected to the metal wiring layer through an opening formed in the surface insulating layer; and a spacer located within a bending area between the first bonding portion and the second bonding portion and formed on the surface insulating layer within a target area to protect the surface insulating layer, the target area being an area within which the surface insulating layer and the structure of the display panel contact each other.

16. The display device according to claim 15, wherein at least one groove is formed in the surface insulating layer within the target area, and wherein the spacer comprises a first spacer filled in the at least one groove.

17. The display device according to claim 16, wherein the spacer further comprises a second spacer formed on the first spacer, and wherein the second spacer is additionally formed in an area including a portion of an upper surface of the surface insulating layer and the at least one groove.

18. The display device according to claim 15, wherein the spacer is formed within a first area between the first bonding portion and the semiconductor chip so as to extend in the first direction.

19. The display device according to claim 15, wherein the spacer is formed within a first area between the first bonding portion and the semiconductor chip or a second area between the semiconductor chip and the second bonding portion so as to extend in a second direction perpendicular to the first direction.

20. The display device according to claim 15, wherein the display panel is an organic light-emitting diode (OLED) panel, and wherein the structure is a metal encapsulation layer protecting a rear surface of the OLED panel.

* * * * *